(12) United States Patent
Guo et al.

(10) Patent No.: US 9,935,425 B2
(45) Date of Patent: Apr. 3, 2018

(54) FIBER COUPLED LASER SOURCE PUMP WITH WAVELENGTH DIVISION MULTIPLEXER

(71) Applicant: Lumentum Operations LLC, Milipitas, CA (US)

(72) Inventors: Yonghong Guo, Union City, CA (US); Jay A. Skidmore, San Jose, CA (US); Xia Hong, Fremont, CA (US); John Martinho, Ottawa (CA); Huijie Xu, Milpitas, CA (US); Lihua Wang, San Jose, CA (US); Yaogeng Ding, Foster City, CA (US); Nicolas Guerin, San Jose, CA (US)

(73) Assignee: Lumentum Operations LLC, Milpitas, CA (US)

( * ) Notice: Subject to any disclaimer, the term of this patent is extended or adjusted under 35 U.S.C. 154(b) by 0 days.

(21) Appl. No.: 15/421,210

(22) Filed: Jan. 31, 2017

(65) Prior Publication Data
US 2017/0222395 A1    Aug. 3, 2017

Related U.S. Application Data

(60) Provisional application No. 62/290,721, filed on Feb. 3, 2016.

(51) Int. Cl.
*H01S 5/022* (2006.01)
*H01S 5/12* (2006.01)

(52) U.S. Cl.
CPC ...... *H01S 5/02288* (2013.01); *H01S 5/02212* (2013.01); *H01S 5/02284* (2013.01); *H01S 5/12* (2013.01)

(58) Field of Classification Search
CPC ........... H01S 3/06754; H01S 3/094003; H01S 5/02288; H01S 5/02284
See application file for complete search history.

(56) References Cited

U.S. PATENT DOCUMENTS

| 6,236,497 B1 | 5/2001 | Andersen et al. |
| 6,438,294 B1 * | 8/2002 | Lauzon ................ G02B 6/4206 372/6 |
| 6,525,872 B1 * | 2/2003 | Ziari ...................... H01S 3/302 359/341.1 |

(Continued)

OTHER PUBLICATIONS

Lumentum Operations LLC, "14-PIN 9XX PUMP LASERS," https://www.lumentum.com/en/optical-communications/products/pump-lasers/14-pin-9xx-pump-lasers, Aug. 1, 2015, 4 pages.

*Primary Examiner* — Eric L Bolda
(74) *Attorney, Agent, or Firm* — Harrity & Harrity, LLP

(57) ABSTRACT

A pump laser package may include an input fiber to send signal light on a first optical path. A first lens may be arranged on the first optical path. The pump laser package may include a source to send pump light on a second optical path. A second lens and a negative lens may be arranged on the second optical path. The first lens and the negative lens may be arranged to create a virtual image associated with the pump light. The pump laser package may include an output fiber on a third optical path. The first lens may be arranged on the third optical path. The pump laser package may include a combiner to receive the signal light on the first optical path, receive the pump light on the second optical path, and send the signal light and the pump light on the third optical path.

21 Claims, 10 Drawing Sheets

(56) References Cited

U.S. PATENT DOCUMENTS

| | | |
|---|---|---|
| 6,922,281 B2 | 7/2005 | Pan et al. |
| 7,044,660 B2 | 5/2006 | Pan et al. |
| 7,130,121 B2 | 10/2006 | Pan et al. |
| 2003/0068119 A1* | 4/2003 | Xie ................... G02B 6/2552 385/24 |
| 2005/0168826 A1* | 8/2005 | Koulikov ............ G02B 6/4206 359/641 |
| 2005/0280888 A1 | 12/2005 | Pan et al. |
| 2006/0001949 A1* | 1/2006 | Sakaguchi .......... H01S 3/06704 359/333 |
| 2012/0141128 A1* | 6/2012 | Bai .................... H04B 10/506 398/65 |

\* cited by examiner

FIBER COUPLED LASER SOURCE PUMP WITH WAVELENGTH DIVISION MULTIPLEXER

RELATED APPLICATION

This application claims priority under 35 U.S.C. § 119 to U.S. Provisional Patent Application No. 62/290,721, filed on Feb. 3, 2016, the content of which is incorporated by reference herein in its entirety.

TECHNICAL FIELD

The present disclosure relates to optical amplifier systems for data communications and telecommunications and, more particularly, to a pump laser package that provides a signal and a pumping beam as a combined optical signal while performing additional optical functions, conserving space, reducing size of optical components of optical amplifier systems, simplifying configuration and/or construction of optical amplifier systems, and/or reducing cost of implementing optical amplifier systems.

BACKGROUND

An optical amplifier systems for data communications and telecommunications may include discrete components for a pump laser, a wavelength division multiplexer (WDM), or the like. These discrete components may be interconnected by fiber splicing together with the signal fiber. Managing these discrete components, the fibers, and the splices necessitates space, requires routing fiber (which may be sensitive to bend radius issues that introduce loss), and requires multiple fiber splices (which may introduce additional loss).

SUMMARY

According to some possible implementations, a pump laser package may include: an input fiber to send signal light on a first optical path in free-space inside a package, where a first lens may be arranged on the first optical path, where the first lens may have a substantially consistent refractive index within a material of the first lens; a source to send pump light on a second optical path in free-space inside the package, where a second lens and a third lens may be arranged on the second optical path, where the third lens may be a negative lens, where the second lens and the third lens may be separated by free-space inside the package, and where the first lens and the third lens may be arranged to create a virtual image, associated with the pump light, at a virtual image plane in free-space inside the package; an output fiber on a third optical path in free-space inside the package, where the first lens may be arranged on the third optical path; and a WDM filter in free-space inside the package to: receive the signal light on the first optical path and send the signal light on the third optical path, receive the pump light on the second optical path and send the pump light on the third optical path, and where the WDM filter may be arranged between the first lens and the third lens.

According to some possible implementations, a fiber coupled laser source may include an input fiber to send input light on a first optical path in free-space inside a package; a laser diode to send source light on a second optical path in free-space inside the package; an output fiber on a third optical path in free-space inside the package; a first lens arranged on the first optical path and the third optical path, where the first lens may comprise a material that has a substantially consistent refractive index; a second lens and a third lens arranged on the second optical path, where the third lens may be a negative lens, where the second lens and the third lens may be separated by free-space inside the package, and where the first lens and the third lens may be arranged to create a virtual image, associated with the source light, at a virtual image plane in free-space inside the package; and a combiner arranged between the first lens and the second lens in free-space inside the package to: receive the input light on the first optical path and send the input light on the third optical path, and receive the source light on the second optical path and send the source light on the third optical path.

According to some possible implementations, a method may include: sending, by an input fiber, signal light on a first optical path in free-space inside a package, where a first lens may be arranged on the first optical path, where the first lens may have a substantially consistent refractive index within a material of the first lens; sending, by a source, pump light on a second optical path in free-space inside the package, where a second lens and a third lens may be arranged on the second optical path, where the second lens and the third lens may be separated by free-space inside the package, where the first lens and the third lens may create a virtual image, associated with the pump light, at a virtual image plane in free-space inside the package, and where the third lens may be a negative lens; receiving, by WDM filter arranged in free-space inside the package, the signal light on the first optical path, where the WDM filter may be arranged between the first lens and the second lens; receiving, by the WDM filter, the pump light on the second optical path; sending, by the WDM filter, the signal light on a third optical path in free-space inside the package to an output fiber on the third optical path, where the first lens may be arranged on the third optical path; and sending, by the WDM filter, the pump light on the third optical path to the output fiber.

DETAILED DESCRIPTION

Figure 1:
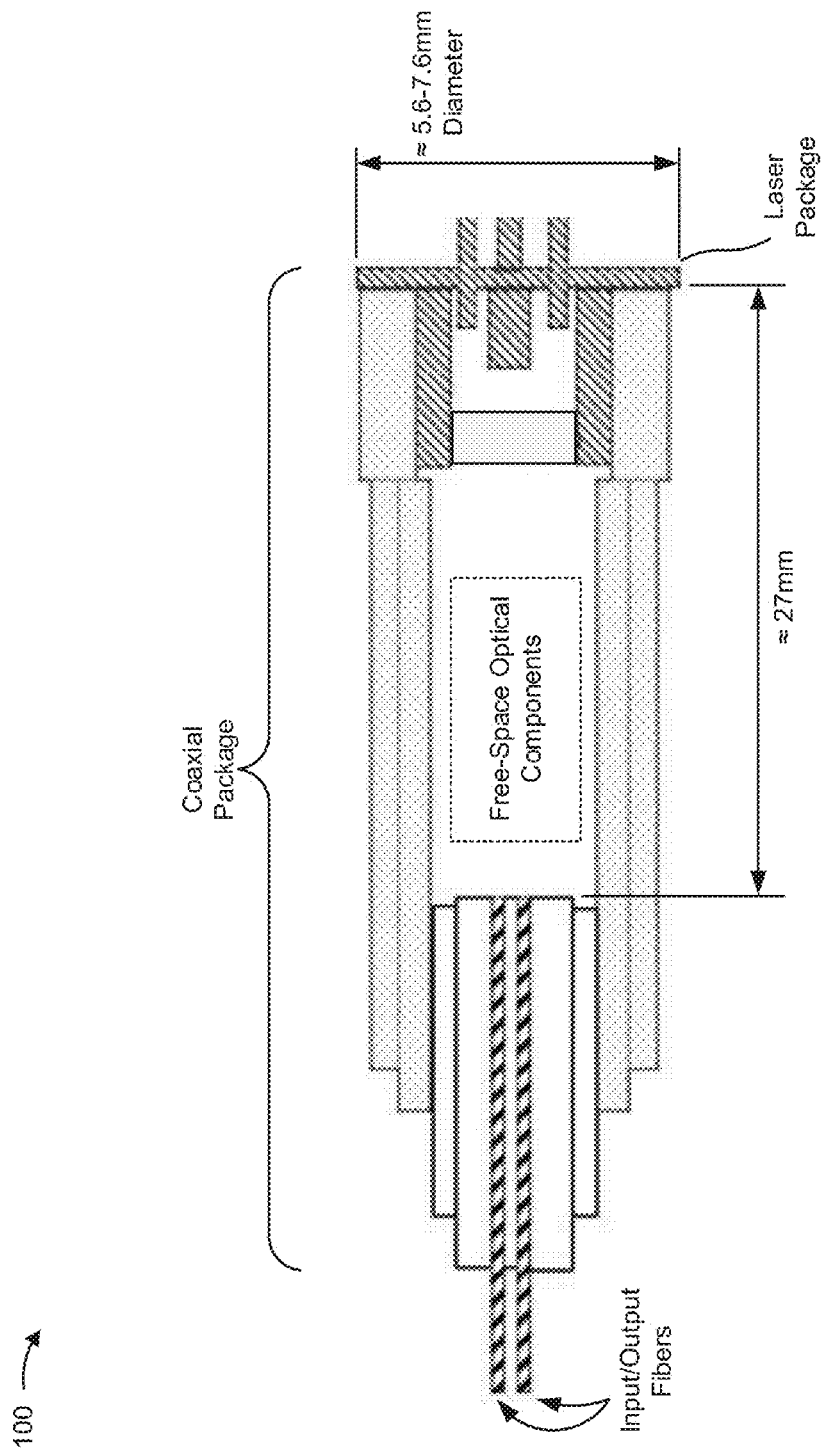
FIG. 1 is a diagram of an example pump laser package in which components, devices, and/or systems described herein may be implemented.

The following detailed description of example implementations refers to the accompanying drawings. The same reference numbers in different drawings may identify the same or similar elements. The implementations described below are merely examples and are not intended to limit the implementations to the precise forms disclosed. Instead, the implementations were selected for description to enable one of ordinary skill in the art to practice the implementations.

A prior optical amplifier system may include discrete components for a pump laser and a wavelength division multiplexer (WDM). These discrete components may be interconnected by fiber splicing together with a signal fiber associated with the optical signal that is to be amplified by the optical amplifier system. However, managing these discrete components, the fibers, and the splices may require physical space, routing fiber (which may be sensitive to bend radius issues that introduce loss), and/or multiple fiber splices (which may introduce additional loss).

Additionally, in a prior optical amplifier system where integration of a pump laser and a WDM within a package is possible, alignment sensitivity when arranging and/or fixing components of the optical amplifier system in place within the package may be significant, thereby decreasing manufacturability and/or increasing cost of the optical amplifier system in order to ensure that acceptable alignment is achieved. For example, such a prior optical amplifier system includes a pair of collimating lenses, where one collimating lens is a GRIN lens arranged between a fiber and the WDM, and another (single) collimating lens is arranged between the laser diode and the WDM. However, alignment of components of the prior optical amplifier system is sensitive with respect to five degrees of freedom (e.g., an x-direction, a y-direction, a z-direction, a polar angle (θ), and an azimuthal angle (φ)) during manufacture and/or assembly.

Moreover, in the prior optical amplifier system using the single collimating lens arranged between the laser diode and the WDM, a welding joint (e.g., a laser welding joint), associated with assembling and/or manufacturing the prior optical amplifier system, is located at a plane corresponding to the laser diode. Location of the welding joint at the laser diode plane results in significant sensitivity with respect to alignment in the x-direction, the y-direction, and the z-direction when assembling and/or manufacturing the prior optical amplifier system. Thus, manufacturing of the prior optical amplifier system and/or ensuring reliability of the prior optical amplifier system may be difficult and/or costly in order to ensure that acceptable alignment with respect to one or more degrees of freedom is achieved.

Implementations described herein provide a pump laser package, including a combiner (e.g., a WDM filter) and three lenses in free-space of a package that provides a signal and a pumping beam as a combined optical signal. Advantages of the implementations described herein may include reducing use of physical space by the optical amplifier system, reducing a number of fibers in the optical amplifier system, reducing a number of fiber splices of the optical amplifier system, reducing size of optical components of the optical amplifier system, simplifying configuration and/or construction of the optical amplifier system, increasing manufacturability of the optical amplifier system, and/or reducing cost of implementing the optical amplifier system (e.g., as compared to a prior optical amplifier system that includes discrete components). Further advantages of the implementations described herein may include reducing alignment sensitivity of the optical amplifier system such that alignment of the components of the optical amplifier system is sensitive with respect to only three degrees of freedom. Additionally, the optical amplifier systems described herein achieve reduced sensitivity with respect to the five degrees of freedom. Such reduced alignment sensitivity increases manufacturability, increases reliability, and/or reduces cost of the optical amplifier system (e.g., as compared to the prior optical amplifier system that includes a single collimating lens arranged between the pump laser and the WDM).

FIG. 1 is a diagram of an example pump laser package 100 in which components, devices, and/or systems described herein may be implemented. In some implementations, pump laser package 100 can realize integration of functional components of an optical amplifier system in a single coaxial package, as described herein. By doing so, discrete and/or bulky optical components such as a pump laser and a WDM (e.g., a 980/1550 WDM filter) may be integrated in a compact package, resulting in significant space saving (e.g., as compared to a prior optical amplifier system). Moreover, labor-intensive fiber splicing among discrete optical components are not needed. As such, small form factor modules, such as an optical amplifier layout in an ultra-small CFPx transmission module, are enabled. In some implementations, pump laser package 100 allows for integration of a hermetically sealed pump laser with four or more other Erbium Doped Fiber Amplifier (EDFA) functional components inside a same fiber-pig-tailed package.

As shown in FIG. 1, in some implementations, pump laser package 100 includes a hermetic sealed portion (e.g., a TO-can or a laser package, as labeled in FIG. 1) that includes a pump laser. In some implementations, the hermetic sealed portion may also include a photodetector and/or one or more other components.

As further shown, pump laser package 100 includes a coaxial package (which may be non-hermetic) between the TO-can and a pair of optical fibers (e.g., an input and an output fiber). As shown, in some implementations, the coaxial package may contain free-space optical components (e.g., between the TO-can and the ends of the fibers) associated with performing one or more optical functions, as described in further detail below.

In some implementations, the coaxial package may have a diameter less than 10 mm. For example, the diameter of the coaxial package may be in a range from approximately 5.6 millimeters (mm) to approximately 7.6 mm. In some implementations, a magnetic ring, included in the coaxial package (not shown), may have an outer diameter of approximately 2 mm (e.g., when the diameter of the coaxial package is approximately 6.6 mm).

In some implementations, a length of the coaxial package, including a TO-can header, may be in a range from approximately 20 mm to approximately 40 mm (e.g., a length of 27 mm is shown in FIG. 1).

In some implementations, the coaxial package may taper in diameter from the TO-can to the fibers and/or may be non-circular in cross-section. In some implementations, an optical path length from a pump chip to a facet of the optical fibers may be approximately 13.5 mm (e.g., when the length of the coaxial package is approximately 27 mm).

In some implementations, a pump laser that utilizes pump laser package 100 may have an output power in a range from approximately 50 milliwatts to approximately 150 milliwatts, may be used in a C-band single channel application, may be used in a narrow channel count application, and/or may be implemented in association with an EDFA.

In some implementations, such a pump laser may have a wavelength range of approximately 970 nanometers (nm) to approximately 980 nm, may not require active cooling to operate, and may produce a beam of pump light of up to approximately 150 milliwatts. In some implementations, the pump laser may produce a beam of pump light of up to approximately 200 milliwatts. In some implementations, the pump laser may operate in an environment with a case temperature in a range from approximately 0 degrees Celsius to approximately 70 degrees Celsius. In some implementations, the pump laser may have a thermistor resistance of approximately 10,000 ohms at a temperature of approximately 25 degrees Celsius. In some implementations, the pump laser may have a fiber pigtail bending radius of less than or equal to approximately 16 mm.

The number, arrangement, size, length, diameter, width, or the like, of portions and components of pump laser package 100 shown in FIG. 1 are provided as examples. In practice, pump laser package 100 may include additional portions and/or components, fewer portions and/or components, different portions and/or components, differently arranged portions and/or components, and/or differently sized portions and/or components, than those shown in FIG. 1.

FIGS. 2A-2H are diagrams of example implementations of fiber coupled laser source pumps (herein referred to as pump lasers) 250-285 that include a combiner (e.g., a wavelength division multiplexer (WDM) filter) and three lenses in free-space inside a package. Pump lasers 250-285 achieve wavelength stabilization of a laser diode and combine a pumping beam and a signal beam into a combined output beam, with reduced alignment sensitivity and/or increased manufacturability, as described herein. In some implementations, pump lasers 250-285 may be housed in pump laser package 100. In the example implementations shown in FIGS. 2A-2G, the arrows represent approximate edge rays of respective optical beams.

Figure 2A:
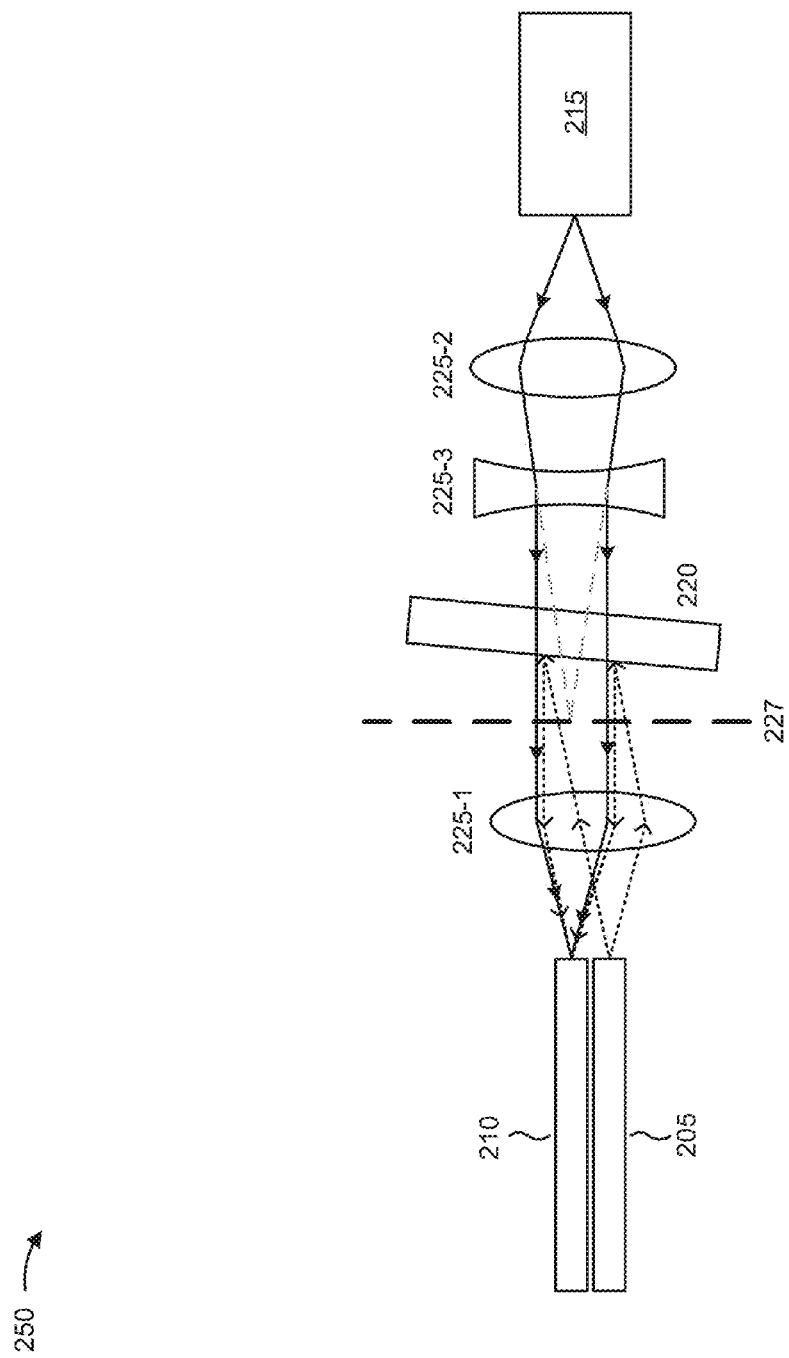
FIGS. 2A-2H are diagrams of example implementations of fiber coupled laser source pumps, include wavelength division multiplexers (WDMs) and three lenses in free-space inside a package, that achieve wavelength stabilization of a laser diode and combine a pumping beam and a signal beam into a combined output beam, with reduced alignment sensitivity and/or increased manufacturability, as described herein.

FIG. 2A is a diagram of an example pump laser 250, including a combiner and three lenses in free-space inside a package, that achieves wavelength stabilization of a laser diode and combines a pumping beam and a signal beam, with reduced alignment sensitivity and increased manufacturability (e.g., as compared to a prior optical amplifier system). As shown in FIG. 2A, pump laser 250 may include an input fiber 205, an output fiber 210, a distributed feedback (DFB) diode 215, a combiner 220, and a lens 225-1, a lens 225-2, and a lens 225-3. Example operation of pump laser 250 is described following descriptions of the example components of pump laser 250.

Input fiber 205 is a fiber for sending signal light (i.e., a beam of signal light) in free-space inside a package of pump laser 250. As shown in FIG. 2A (by the dotted lines pointing in the right direction), input fiber 205 may be arranged such that input fiber 205 sends the signal light on an optical path from a facet of input fiber 205, via lens 225-1, to combiner 220 (herein referred to as a first optical path).

DFB diode 215 is a DFB diode for sending pump light (i.e., a beam pump light, source light) in the free-space inside the package of pump laser 250. In some implementations, DFB diode 215 is capable of sending the pump light at a particular wavelength (e.g., approximately 980 nm) without receiving any reflected pump light (i.e., DFB diode 215 may achieve wavelength stabilization internally). As shown in FIG. 2A (by the solid lines pointing in the left direction on the right side of combiner 220), DFB diode 215 may be arranged such that DFB diode 215 sends the pump light on an optical path from a facet of DFB diode 215, via lens 225-2 and lens 225-3, to combiner 220 (herein referred to as a second optical path). In some implementations, use of DFB diode 215 may simplify implementation and/or reduce cost as compared to a pump laser that uses a Fabry-Perot diode or another type of diode that requires a lasing cavity external to the laser diode.

Output fiber 210 is a fiber for receiving signal light and pump light (i.e., the signal light combined with the pump light, herein referred to as signal+pump light) via the free-space inside the package of pump laser 250, and outputting the signal+pump light. As shown in FIG. 2A (by the dotted lines pointing in the left direction and the solid lines pointing in the left direction on the left side of combiner 220), output fiber 210 may be arranged such that output fiber 210 receives the signal+pump light on an optical path from combiner 220, via lens 225-1, to a facet of output fiber 210 (herein referred to as a third optical path). As shown, in some implementations, input fiber 205 and output fiber 210 may be arranged in fiber pigtail at a first end of the package of pump laser 250.

Combiner 220 includes a component for combining beams of light by, for example, transmitting (i.e., passing) a first beam of light (e.g., the pump light) and reflecting a second beam of light (e.g., the signal light) based on wavelengths of the beams of light, based on directions of the beams of light, based on sources of the beams of light, or the like. For example, combiner 220 may include a WDM filter, a low-pass filter, a beam combiner, or the like. In some implementations, combiner 220 may transmit light of a wavelength of approximately 980 nm (e.g., pump light), and may reflect light of a wavelength of approximately 1550 nm (e.g., signal light). However, other examples are possible, and combiner 220 may transmit or reflect light of one or more other wavelengths. In some implementations, combiner 220 may be tilted relative to an optical axis of pump laser 250 (e.g., as shown in FIG. 2A) in order to ease alignment of the signal light to output fiber 210.

As shown in FIG. 2A, in some implementations, combiner 220 may be arranged to receive the signal light sent on the first optical path by input fiber 205, and send (reflect) the signal light on the third optical path to output fiber 210. As further shown, combiner 220 may be arranged to receive the pump light sent on the second optical path by DFB diode 215, and send (transmit) the pump light on the third optical path to output fiber 210. As further shown, in some implementations, combiner 220 may be arranged between lens 225-1 and lens 225-3. In some implementations, combiner 220 may be separated from lens 225-1 and lens 225-3 by the free-space inside the package of pump laser 250.

Lens 225-1 includes a lens for collimating a beam of light or focusing a beam of collimated light within the free-space of the package of pump laser 250. For example, functions of lens 225-1 may include collimating the signal light on the first optical path, focusing the pump light on the third optical path, focusing the signal light on the third optical path, or the like. As shown in FIG. 2A, in some implementations, lens 225-1 may be arranged in the free-space of the package on the first optical path and the third optical path (e.g., between fibers 205/210 and combiner 220). In some implementations, lens 225-1 may have a substantially consistent refractive index within a material from which lens 225-1 is composed (i.e., lens 225-1 may not be a gradient index (GRIN) lens).

Lens 225-2 includes a lens for causing a beam of light to converge within the free-space of the package of pump laser 250. For example, as shown in FIG. 2A, a function of lens 225-2 may include causing the pump light, sent by DFB diode 215, to converge on a portion of the second optical path (e.g., on a portion of the second optical path from lens 225-2 to lens 225-3). As shown in FIG. 2A, in some implementations, lens 225-2 may be arranged in the free-space of the package on the second optical path (e.g., between DFB diode 215 and lens 225-3).

Lens 225-3 includes a negative lens for collimating a converging beam of light within the free-space of the package of pump laser 250. For example, as shown in FIG. 2A, a function of lens 225-3 may include collimating the pump light (e.g., after passing through lens 225-2) such that the pump light is collimated on a portion of the second optical path (e.g., on a portion of the second optical path from lens 225-3 to combiner 220). As shown in FIG. 2A, in some implementations, lens 225-3 may be arranged in the free-space of the package on the second optical path (e.g., between lens 225-2 and combiner 220).

In some implementations, lens 225-3 and lens 225-1 may be arranged such that a virtual image, associated with the pump light on the second optical path, is located at virtual image plane 227 (e.g., a plane perpendicular to the optical axis, shown as a dashed vertical black line in FIG. 2A) in the free-space of the package. For example, as shown in FIG. 2A (e.g., by the dashed gray lines that converge to a point at the dashed black line), lens 225-3 and lens 225-1 may be arranged such that a virtual image, associated with the pump light, is located at virtual image plane 227 (e.g., located between lens 225-1 and combiner 220). In some implementations, lens 225-3 and lens 225-1 may be arranged such that virtual image plane 227 is located at another point within the free-space of the package.

In some implementations, alignment sensitivity of pump laser 250 may be reduced by use of discrete lenses 225-2 and 225-3 on the second optical path (e.g., as compared to the prior optical amplifier system that uses a single collimating lens between the laser diode and the combiner). For example, in some implementations, use of lenses 225-2 and 225-3 within the free-space of the package of pump laser 250 reduces alignment sensitivity of components of pump laser 250 such that pump laser 250 is sensitive to alignment changes with respect to only three degrees of freedom (e.g., alignments with respect to three orthogonal directions, such as an x-direction, a y-direction, and a z-direction). Here, since use of discrete lenses 225-2 and 225-3 allows for a virtual image to be created at virtual image plane 227, a welding joint plane (e.g., a laser welding joint plane) may be located at virtual image plane 227, which reduces and/or eliminates sensitivity to alignments associated with angular degrees of freedom (e.g., alignments with respect to a polar angle, an azimuthal angle, etc.) since all light from the virtual image point will be imaged to a receiving fiber, regardless of its incident angle. Thus, manufacturability of pump laser 250 may be increased and/or a cost of pump laser may be reduced due to the use of discrete lenses 225-2 and 225-3 (e.g., as compared to the prior optical amplifier system that includes a single lens). In some implementations, the weld joint may be near to the virtual image plane 227 reducing sensitivity, but not necessarily reducing sensitivity as much as in implementations where the weld joint may be at the virtual image plane 227. In some implementations, the welding joint, associated with manufacturing or assembling pump laser 250 may be located between output fiber 210 combiner 220.

Moreover, alignment sensitivity of pump laser 250 (e.g., with respect to the x-direction, the y-direction, and the z-direction) may be reduced based on the creation of the virtual image at virtual image plane 227. For example, the virtual image created at virtual image plane 227 may be larger than a physical size of the source of the pump light at DFB diode. Here, since alignment sensitivity in the x-direction, the y-direction, and the z-direction is depends on image size, the alignment sensitivity in the x-direction, the y-direction, and/or the z-direction may be reduced (since the virtual image is enlarged).

Figure 3:
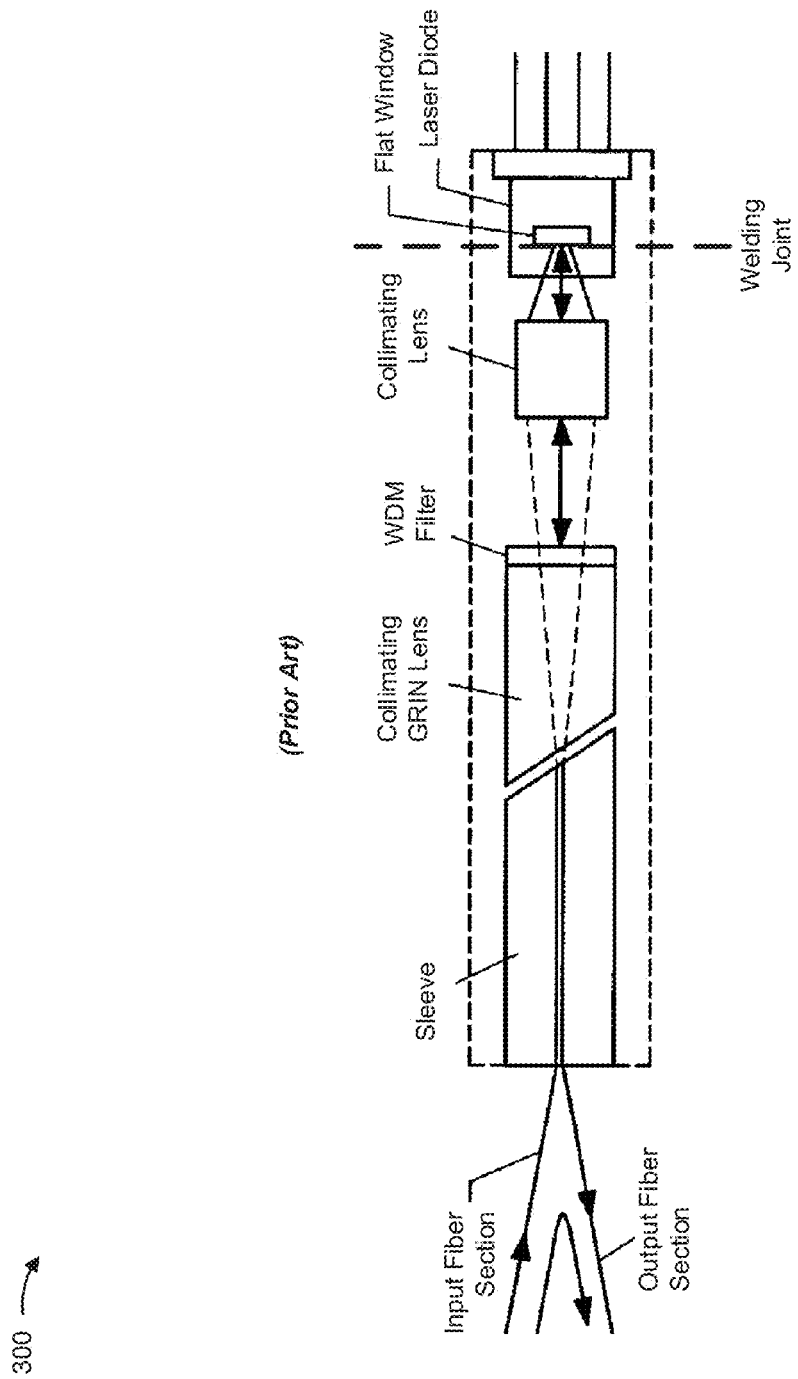
FIG. 3 is a diagram of a prior optical amplifier system that includes a single lens arranged between a WDM and a laser diode.

Conversely, as described above and as shown in FIG. 3, for the prior optical amplifier system that uses the single lens between a combiner and a diode, a welding joint plane (e.g., a laser welding joint plane), associated with manufacturing and/or assembling the prior optical amplifier system, is located at a plane corresponding to the diode. As shown in FIG. 3, use of a single lens arranged between the diode and the combiner does not create a virtual image, associated with the pump light, within the free-space of the package. Therefore, as shown in FIG. 3, a welding joint, associated with manufacturing and/or assembling the prior optical amplifier system of FIG. 3, is located at a plane corresponding to the laser diode facet (e.g., rather than within the free-space inside the package). Since the near field is smallest at the laser diode facet plane, the prior optical amplifier will be more sensitive to misalignment at the welding joint.

However, returning to FIG. 2A, lens 225-3 and lens 225-1 may be arranged to create a virtual image, associated with the pump light, at virtual image plane 227. In this case, a welding joint, associated with manufacturing and/or assembling pump laser 250, may be located at virtual image plane 227. In some implementations, as described above, locating the welding joint at virtual image plane 227 (e.g., between lens 225-1 and combiner 220) reduces alignment sensitivity in the x-direction, the y-direction, and the z-direction (e.g., by a factor of two, by a factor of three, or the like), as compared to the prior optical amplifier system shown in FIG. 3, and/or removes alignment sensitivity with respect to angular degrees of freedom (e.g., thus obviating a need for angular alignment), thereby increasing manufacturability and/or reducing cost of pump laser 250.

In some implementations, the facet of input fiber 205, the facet of output fiber 210, combiner 220, lens 225-1, lens 225-2, and/or lens 225-3 may be included in an enclosure that is not hermetically sealed. Additionally, or alternatively, one or more of the facet of input fiber 205, the facet of output fiber 210, combiner 220, lens 225-1, lens 225-2, and/or lens 225-3 may be enclosed in a hermetically sealed enclosure. In some implementations, lens 225-2 may be used as a hermitic sealing window in a TO-can. In a case where flat glass is used as a hermitic sealing window, then lens 225-2 and lens 225-3 may not be hermetically sealed.

During operation, input fiber 205 sends the signal light (e.g., 1550 nm light) on the first optical path from the facet of input fiber 205 to combiner 220 (e.g., via lens 225-1), and DFB diode 215 sends the pump light (e.g., 980 nm light) on the second optical path from the facet of DFB diode 215 to combiner 220 (e.g., via lens 225-2 and 225-3). Combiner 220 reflects the signal light, received on the first optical path, onto the third optical path (e.g., from combiner 220, via lens 225-1, to the facet of output fiber 210), while simultaneously transmitting the pump light, received on the second optical path, onto the third optical path. Here, by sending the signal light and the pump light on the third optical path, combiner 220 causes the signal light and the pump light to be combined (i.e., to form the signal+pump light) at the facet of output fiber 210. Output fiber 210 then outputs the signal+pump light.

Figure 2B:
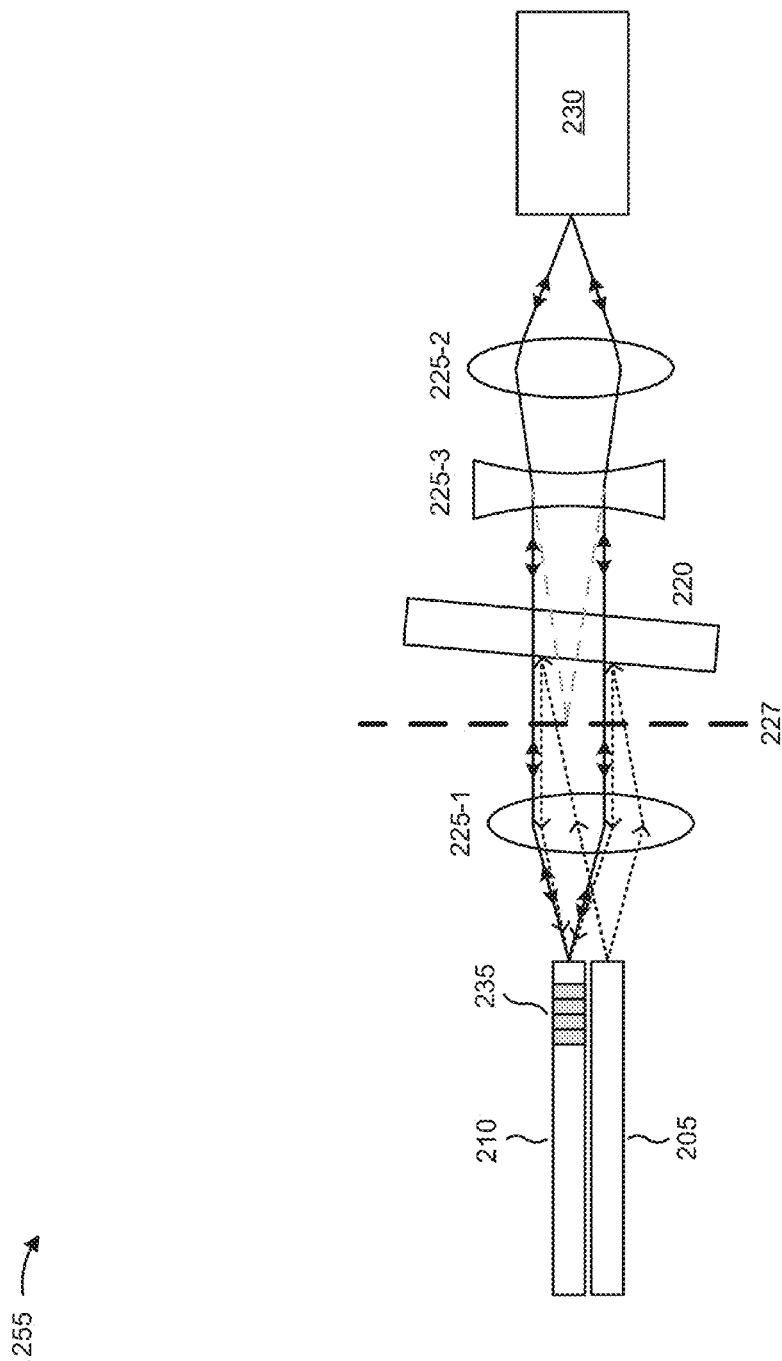

FIG. 2B is a diagram of an example pump laser 255, including a combiner and three lenses in free-space inside a package, that achieves wavelength stabilization of a laser diode and combines a pumping beam and a signal beam, with reduced alignment sensitivity and increased manufacturability. As shown in FIG. 2B, pump laser 255 may include input fiber 205, output fiber 210, combiner 220, lens 225-1, lens 225-2, lens 225-3, a Fabry-Perot (FP) diode 230, and a fiber Bragg grating (FBG) 235. Input fiber 205, output fiber 210, combiner 220, lens 225-1, lens 225-2, and lens 225-3 may be arranged and/or may operate in a similar manner as described above.

FP diode 230 is an FP diode for sending the pump light (i.e., source light) in the free-space inside the package of pump laser 255. In some implementations, FP diode 230 sends the pump light with a particular wavelength (e.g., approximately 980 nm) based on a portion of the pump light reflected back to FP diode 230 by FBG 235. In other words, the wavelength of the pump light sent by FP diode 230 may be stabilized by FBG 235. As shown in FIG. 2B (by the solid lines pointing in the left direction on the right side of combiner 220), FP diode 230 may be arranged such that FP diode 230 sends the pump light on the second optical path (e.g., from a facet of FP diode 230, via lens 225-2 and lens 225-3, to combiner 220). The combiner 220 then sends the pump light on the third optical path, as described in greater detail below.

FBG 235 is a fiber Bragg grating, integrated in output fiber 210, for partially reflecting (i.e., reflecting a portion of) the pump light, sent by FP diode 230, in order to stabilize the wavelength of the pump light sent by FP diode 230 in the free-space of the package of pump laser 255 (e.g., such that FP diode 230 sends pump light with a wavelength of approximately 980 nm). For example, FBG 235 may take the form of a periodic or aperiodic perturbation of an effective refractive index in a core of output fiber 210 that causes light of a particular wavelength (e.g., 980 nm) to be partially reflected. In some implementations, FBG 235 may include another type of grating.

During operation, input fiber 205 sends the signal light (e.g., 1550 nm light) on the first optical path from the facet of input fiber 205 to combiner 220 (e.g., via lens 225-1), and FP diode 230 sends the pump light (e.g., 980 nm light) on the second optical path from the facet of FP diode 230 to combiner 220 (e.g., via lens 225-2 and lens 225-3). Combiner 220 reflects the signal light, received on the first optical path, onto the third optical path (e.g., from combiner 220, via lens 225-1, to the facet of output fiber 210), while simultaneously transmitting the pump light, received on the second optical path, onto the third optical path. Here, by sending the signal light and the pump light on the third optical path, combiner 220 causes the signal light and the pump light to be combined (i.e., to form the signal+pump light) at the facet of output fiber 210. Output fiber 210 then outputs the signal+pump light. Additionally, FBG 235 partially reflects the pump light back to FP diode 230 (e.g., in a reverse direction on the third optical path and the second optical path; via lens 225-1, combiner 220, lens 225-3, and lens 225-2) in order to stabilize the wavelength of the pump light sent by FP diode 230.

Figure 2C:
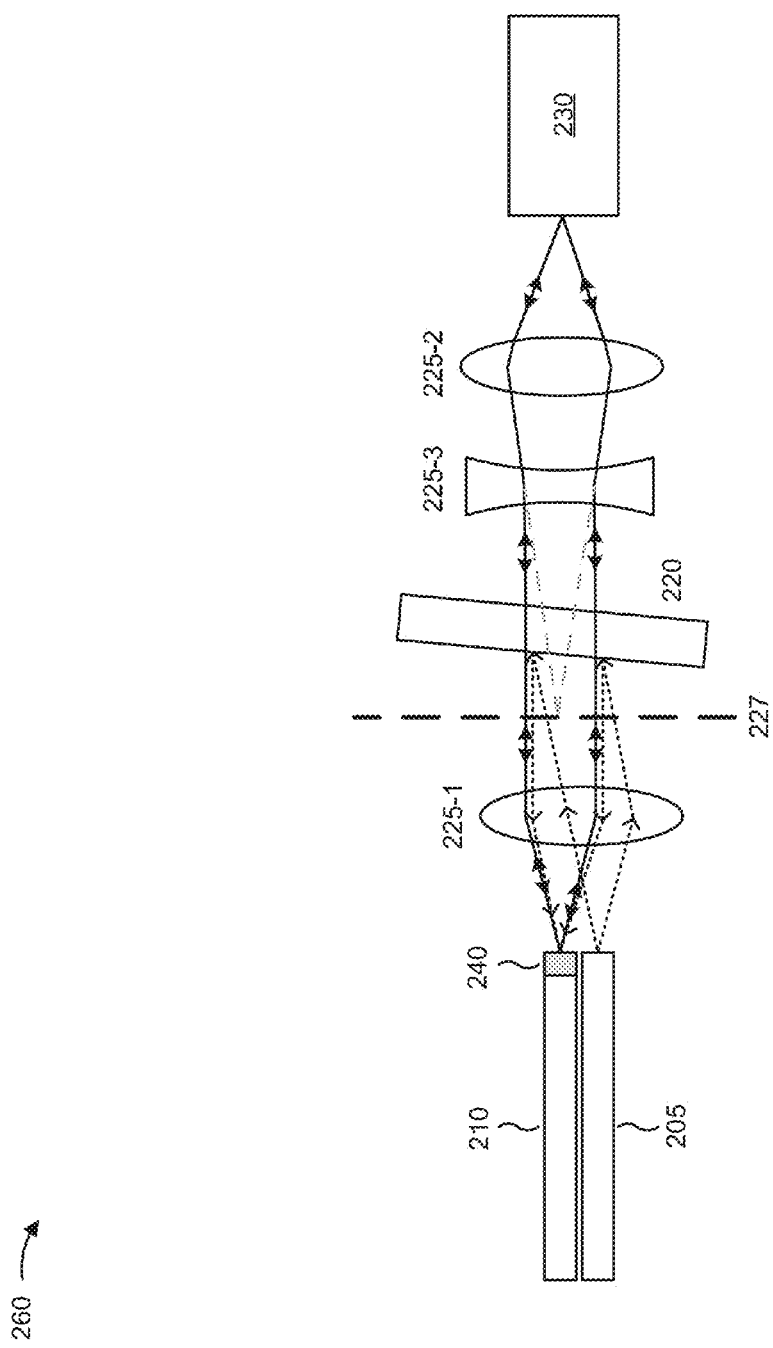

FIG. 2C is a diagram of an example pump laser 260, including a combiner and three lenses in free-space inside a package, that achieves wavelength stabilization of a laser diode and combines a pumping beam and a signal beam, with reduced alignment sensitivity and/or increase manu-facturability. As shown in FIG. 2C, pump laser 260 may include input fiber 205, output fiber 210, combiner 220, lens 225-1, lens 225-2, lens 225-3, FP diode 230, and a reflective narrowband device 240. Input fiber 205, output fiber 210, combiner 220, lens 225-1, lens 225-2, lens 225-3, and FP diode 230 may be arranged and/or may operate in a similar manner as described above.

Reflective narrowband device 240 is a component for partially reflecting the pump light, sent by FP diode 230, in order to stabilize the wavelength of the pump light sent by FP diode 230 in the free-space of the package of pump laser 255 (e.g., such that FP diode 230 sends pump light with a wavelength of approximately 980 nm). In some implementations, reflective narrowband device 240 may be in the form of a coating on a surface, within the free-space of the package of pump laser 260, upon which the pump light is incident. For example, as shown in FIG. 2C, reflective narrowband device 240 may be in the form of a coating on the facet of output fiber 210 on which the signal+pump light is incident. In some implementations, such a coating may be applied to an additional surface and/or a different surface in the package of pump laser 260 (e.g., a surface of lens 225-1, a surface of lens 225-2, a surface of lens 225-3, a surface of combiner 220, or the like).

In some implementations, the surface on which the coating is applied may transmit light with wavelengths other than a particular wavelength (e.g., the coating may transmit light with wavelengths other than approximately 980 nm), and may reflect a narrow wavelength band at the particular wavelength (e.g., the coating may reflect light with a wavelength of approximately 980 nm). In some implementations, the surface on which the coating is applied may have approximately 2-4% reflectivity. In this way, the surface of the coating may allow for spectral shaping of FP diode 230.

During operation, input fiber 205 sends the signal light (e.g., 1550 nm light) on the first optical path from the facet of input fiber 205 to combiner 220 (e.g., via lens 225-1), and FP diode 230 sends the pump light (e.g., 980 nm light) on the second optical path from the facet of FP diode 230 to combiner 220 (e.g., via lens 225-2 and lens 225-3). Combiner 220 reflects the signal light, received on the first optical path, onto the third optical path (e.g., from combiner 220, via lens 225-1, to the facet of output fiber 210), while simultaneously transmitting the pump light, received on the second optical path, onto the third optical path. Here, by sending the signal light and the pump light on the third optical path, combiner 220 causes the signal light and the pump light to be combined (i.e., to form the signal+pump light) at the facet of output fiber 210. Output fiber 210 then outputs the signal+pump light. Additionally, reflective narrowband device 240 (e.g., a coating on the facet of output fiber 210) partially reflects the pump light back to FP diode 230 (e.g., in a reverse direction on the third optical path and the second optical path; via lens 225-1, combiner 220, lens 225-3, and lens 225-2) in order to stabilize the wavelength of the pump light sent by FP diode 230.

Figure 2D:
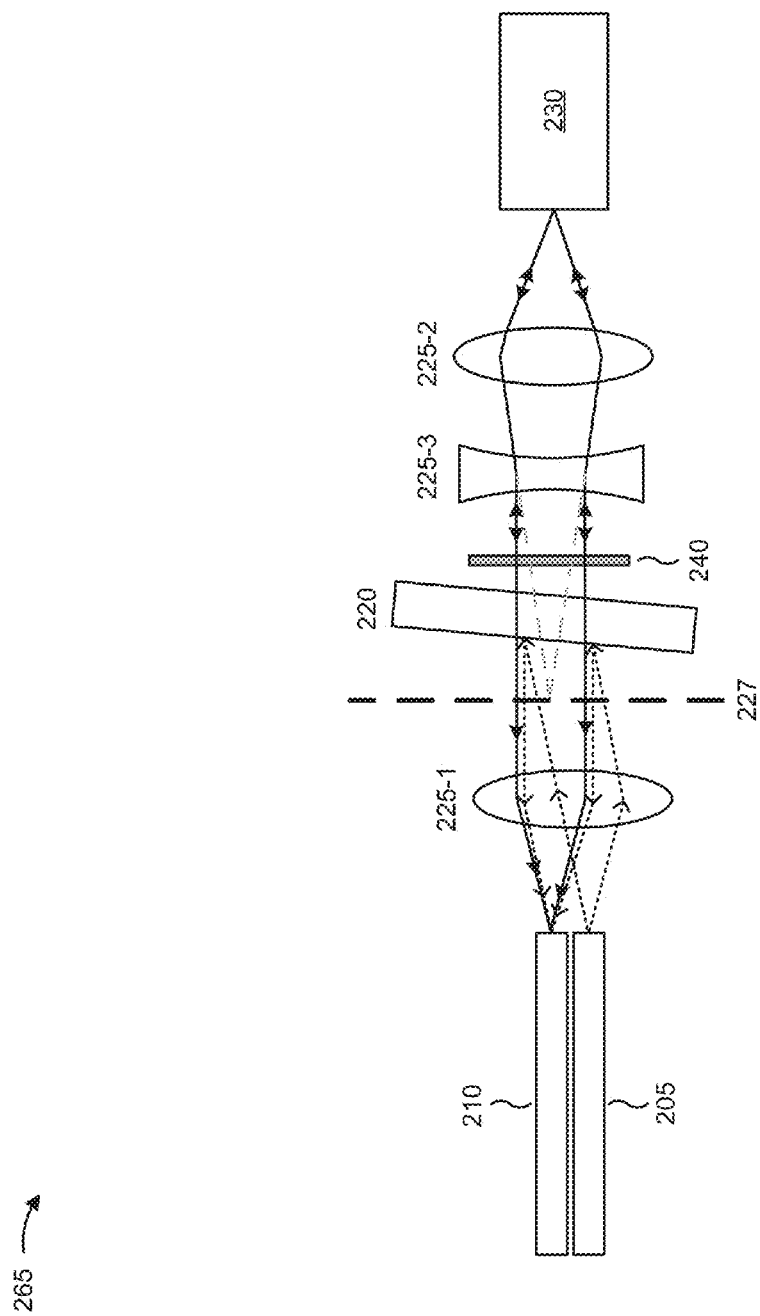

FIG. 2D is a diagram of an example pump laser 265, including a combiner and three lenses in free-space inside a package, that achieves wavelength stabilization of a laser diode and combines a pumping beam and a signal beam, with reduced alignment sensitivity and/or increased manu-facturability. As shown in FIG. 2D, pump laser 265 may include input fiber 205, output fiber 210, combiner 220, lens 225-1, lens 225-2, lens 225-3, FP diode 230, and reflective narrowband device 240. Input fiber 205, output fiber 210, combiner 220, lens 225-1, lens 225-2, lens 225-3, FP diode 230, and/or reflective narrowband device 240 may be arranged and/or may operate in a similar manner as described above.

As described above, reflective narrowband device 240 is a component for partially reflecting the pump light, sent by FP diode 230, in order to stabilize the wavelength of the pump light sent by FP diode 230 in the free-space of the package of pump laser 255. In some implementations, as shown in FIG. 2D, reflective narrowband device 240 may be in the form of a discrete component in the free-space inside the package of pump laser 265. For example, reflective narrowband device 240 may be a volume holographic grating (VHG, also known as a volume Bragg grating), a reflective narrowband filter, a passband filter with partial broadband reflector (e.g., with several % reflectivity), or the like. In some implementations, broadband feedback can be provided by one or more other optical surfaces within the package of pump laser 265.

In some implementations, reflective narrowband device 240, when in the form of a discrete component may be arranged on the second optical path (e.g., between combiner 220 and lens 225-3 as shown in FIG. 2D). Additionally, or alternatively, reflective narrowband device 240, when in the form of a discrete component, may be arranged at another location in the free-space of the package, such as at another location on the second optical path (e.g., between lens 225-3 and lens 225-2, between lens 225-2 and the facet of FP diode 230), on the third optical path (e.g., between combiner 220 and lens 225-1, between lens 225-1 and the facet of output fiber 210), and/or on the first optical path. In some implementations, a discrete component reflective narrowband device 240 may simplify large-scale fabrication in a wafer format. In this way, a cost of implementation and an amount of variability between different pump lasers may be reduced.

As shown in FIG. 2D, in some implementations, combiner 220 and the discrete component reflective narrowband device 240 may be angled at a particular relative angle (e.g., in a range of approximately 2 degrees to approximately 5 degrees). In other implementations, combiner 220 and the discrete component reflective narrowband device 240 may be parallel to each other, and one or both of combiner 220 and reflective narrowband device 240 may be configured to deflect light from FP diode 230 at a particular angle (e.g. for reducing coupling of unwanted back-reflections or feedback).

During operation, pump laser 265 may operate in a manner as that described in association with pump laser 260 of FIG. 2C. However, the discrete component reflective narrowband device 240 (e.g., arranged between combiner 220 and lens 225-3) partially reflects the pump light back to FP diode 230 (e.g., in a reverse direction on a portion of the second optical path; via lens 225-3 and lens 225-2) in order to stabilize the wavelength of the pump light sent by FP diode 230.

Figure 2E:
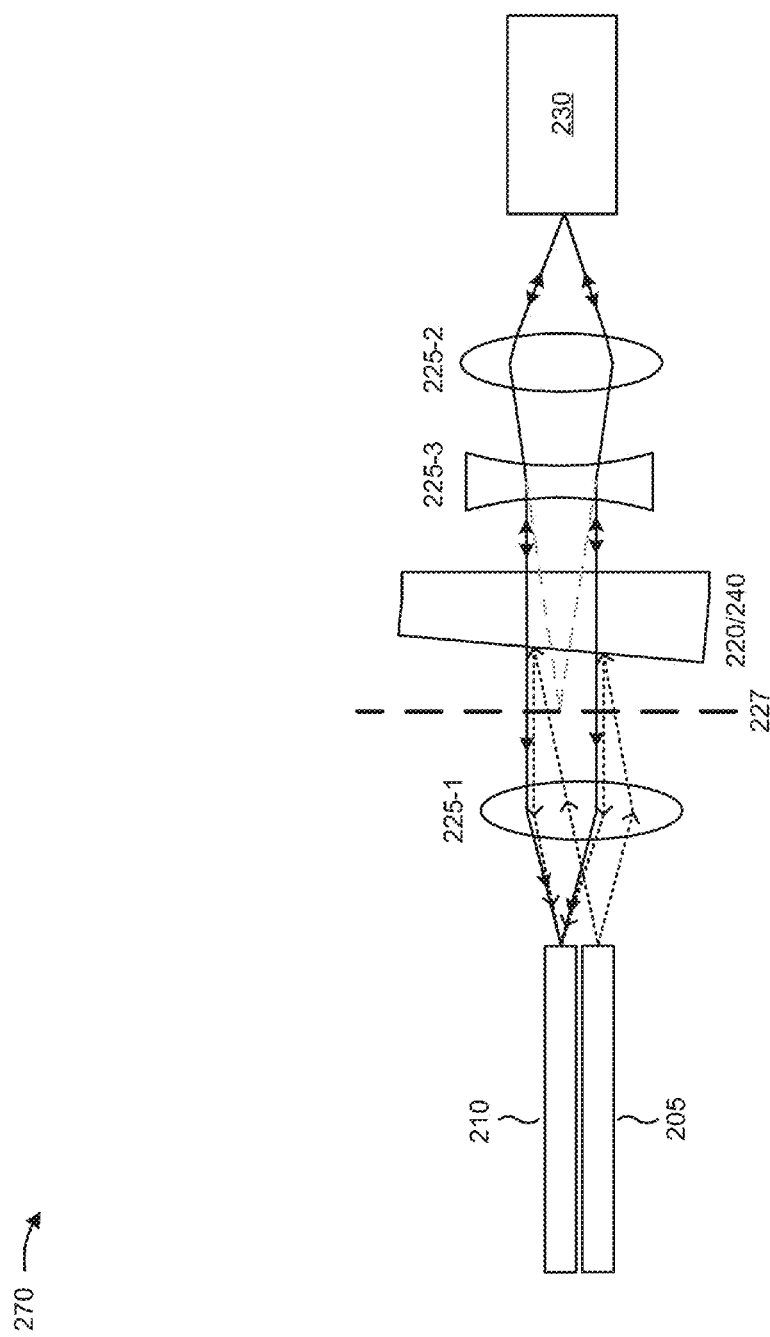

FIG. 2E is a diagram of an example pump laser 270, including a combiner and three lenses in free-space inside a package, that achieves wavelength stabilization of a laser diode and combines a pumping beam and a signal beam, with reduced alignment sensitivity and/or increased manufacturability. As shown in FIG. 2E, pump laser 270 may include input fiber 205, output fiber 210, combiner 220, lens 225-1, lens 225-2, lens 225-3, FP diode 230, and reflective narrowband device 240. Input fiber 205, output fiber 210, lens 225-1, lens 225-2, lens 225-3, and/or FP diode 230 may be arranged and/or may operate in a similar manner as described above.

As described above, reflective narrowband device 240 is a component for partially reflecting the pump light, sent by FP diode 230, in order to stabilize the wavelength of the pump light sent by FP diode 230 in the free-space of the package of pump laser 255. In some implementations, as shown in FIG. 2E, reflective narrowband device 240 may be integrated with combiner 220 (e.g., such that combiner 220 and reflective narrowband device 240 are included in a single component within the free-space of pump laser 270). For example, the integrated combiner 220/reflective narrowband device 240 may be a VHG (Volume Holographic Grating) with a WDM coating, a WDM coating with a low-reflective narrowband coating, or the like. In some implementations, as shown in FIG. 2E, a combiner 220 portion of such an integrated component (e.g., the left portion of component 220/240 in FIG. 2E) and a reflective narrowband device 240 portion of the integrated component (e.g., the right portion of component 220/240 in FIG. 2E) may have different incident angles.

During operation, pump laser 270 may operate in a manner as that described in association with pump laser 260 of FIG. 2D. However, the integrated combiner 220/reflective narrowband device 240 partially reflects the pump light back to FP diode 230 (e.g., in a reverse direction on the second optical path; via lens 225-3 and lens 225-2) in order to stabilize the wavelength of the pump light sent by FP diode 230.

Figure 2F:
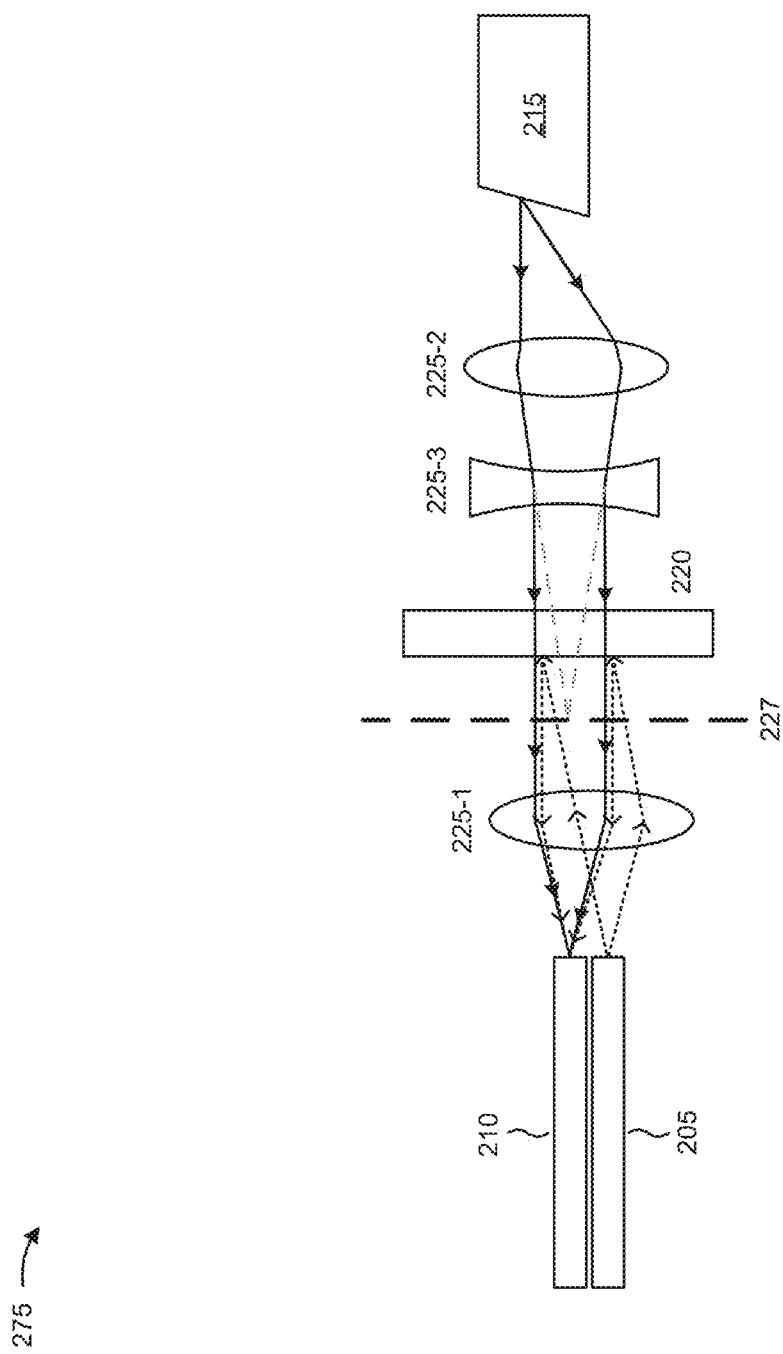
Figure 2G:
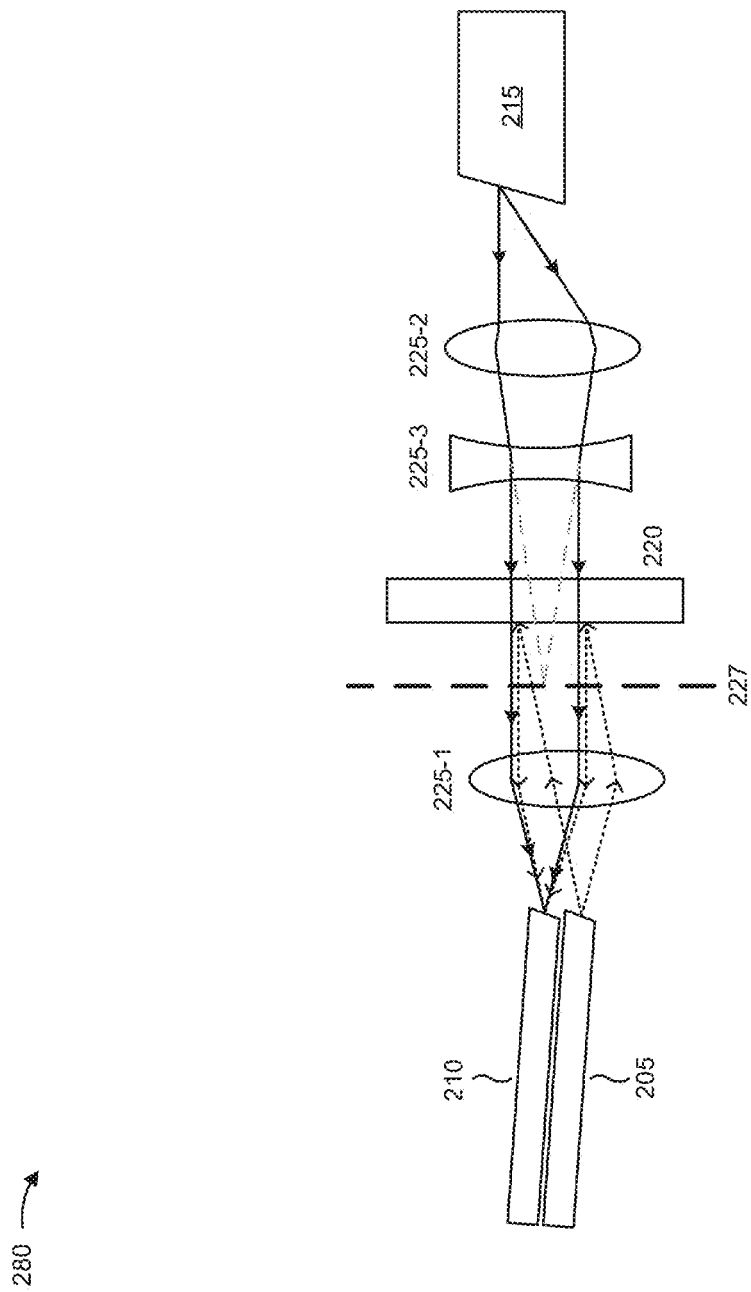

FIGS. 2F and 2G are diagrams of example pump lasers 275 and 280, respectively, that may improve efficacy of wavelength stabilization of the pump light beam with regard to a desired wavelength by using angled facets. The use of angled facets may attenuate broadband feedback from reaching a laser diode (e.g., DFB diode 215 or FP diode 230) that would otherwise compete with feedback intended to stabilize the wavelength of the laser diode. For example, in some implementations, the facet of the laser diode from which the pump light is sent may be an angled waveguide (e.g., as shown in FIGS. 2F and 2G), rather than a straight waveguide (e.g., as in shown in FIGS. 2A-2E). Notably, while pump lasers 275 and 280 are shown as including DFB diode 215 (e.g., as described in connection with FIG. 2A), a similar technique may be used for a pump laser including FP diode 230 (e.g., as described in connection with FIGS. 2B-2E).

As shown in FIG. 2F, in some implementations, DFB diode 215 may include an angled first (e.g., front) facet to reflect light away from the diode in order to improve wavelength stabilization. Here, since a second (e.g., back) facet of DFB diode 215 typically remains at normal incidence to the diode waveguide, the diode waveguide may be bent at a shallow angle (e.g., 2 degrees, 3 degrees, or a larger or smaller angle greater than 0 degrees) to produce an angled front facet.

In some implementations, the angle at which the pump light is emitted from DFB diode 215 is different from that shown in, for example, the example implementation shown in FIG. 2E. For example, a rotation of DFB diode 215, locations of lens 225-1 and lens 225-2, and/or a fiber tail assembly (FTA) of pump laser 275 can be selected to modify the angle at which the pump light is emitted and/or reflected. In this way, pump laser 275 can improve coupling efficiency of the signal light and the pump light with regard to output fiber 210, which improves efficiency of pump laser 275.

Similarly, as shown in FIG. 2G, in some implementations, pump laser 280 may include angled facets at proximal ends of input fiber 205 and output fiber 210. Such an arrangement may reduce an amount of broadband feedback that reaches DFB diode 215 and/or may reduce feedback to input fiber 205 and/or output fiber 210.

In some implementations, input fiber 205 and/or output fiber 210 may be angled to reduce feedback (i.e., reflection) to input fiber 205 and/or output fiber 210 and to DFB diode 215. In some implementations, the angle of the facet of input fiber 205 and/or output fiber 210 may be in a range from approximately 5 degrees to approximately 10 degrees (e.g., approximately 8 degrees). The feedback from the facet of DFB diode 215 and distal ends of input fiber 205 and/or output fiber 210 (e.g., ends opposite from the angled facets) may behave independently. In some implementations, anti-reflective (AR) coatings with low reflectivity may be used, rather than angled facets, for reducing feedback.

Figure 2H:
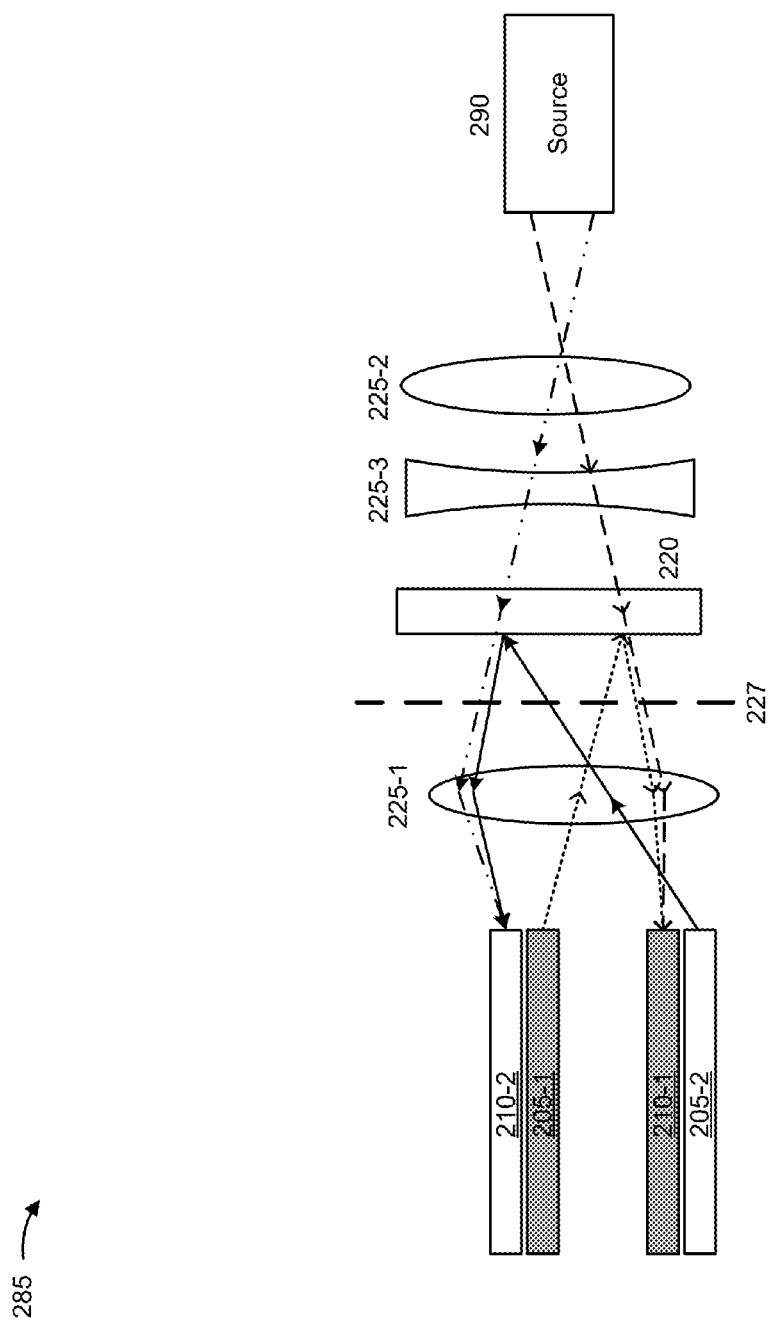

FIG. 2H is a diagram of an example pump laser 285, including a combiner and three lenses in free-space inside a package, that achieves wavelength stabilization of a laser diode, combines a first pumping beam and a first signal beam, and combines a second pumping beam and a second signal beam, with reduced alignment sensitivity and/or increased manufacturability. As shown in FIG. 2E, pump laser 285 may include a first input fiber (e.g., input fiber 205-1), a second input fiber 205 (e.g., input fiber 205-2), a first output fiber 210 (e.g., output fiber 210-1), a second output fiber 210 (e.g., output fiber 210-2), a source 290 (e.g., including a chip with two emission points capable of emitting two beams of pump light, two DFB diodes 215, two FP diodes 230 or the like), combiner 220, lens 225-1, lens 225-2, and lens 225-3. In the example implementation shown in FIG. 2H, the arrows represent center rays of respective optical beams.

Input fibers 205-1 and 205-2, output fibers 210-1 and 210-2, combiner 220, lens 225-1, lens 225-2, and lens 225-3 may be arranged and/or may operate in a similar manner as described above.

During operation, input fiber 205-1 sends first signal light (e.g., a first beam of 1550 nm signal light) on a first optical path from the facet of input fiber 205-1 to combiner 220 (e.g., via lens 225-1) and DFB diode 215 sends first pump light (e.g., a first beam of 980 nm light) on a second optical path from the facet of DFB diode 215 to combiner 220 (e.g., via lens 225-2 and lens 225-3). Combiner 220 reflects the first signal light, received on the first optical path, onto a third optical path (e.g., from combiner 220, via lens 225-1, to a facet of output fiber 210-1), while simultaneously transmitting the first pump light, received on the second optical path, onto the third optical path. Here, by sending the first signal light and the first pump light on the third optical path, combiner 220 causes the first signal light and the first pump light to be combined (i.e., to form first signal+pump light) at the facet of output fiber 210-1. Output fiber 210-1 then outputs the first signal+pump light.

Similarly, input fiber 205-2 sends second signal light (e.g., a second beam of 1550 nm signal light) on a fourth optical path from the facet of input fiber 205-2 to combiner 220 (e.g., via lens 225-1) and DFB diode 215 sends second pump light (e.g., a second beam of 980 nm light) on a fifth optical path from the facet of DFB diode 215 to combiner 220 (e.g., via lens 225-2 and lens 225-3). Combiner 220 reflects the second signal light, received on the fourth optical path, onto a sixth optical path (e.g., from combiner 220, via lens 225-1, to a facet of output fiber 210-2), while simultaneously transmitting the second pump light, received on the fifth optical path, onto the sixth optical path. Here, by sending the second signal light and the second pump light on the sixth optical path, combiner 220 causes the second signal light and the second pump light to be combined (i.e., to form second signal+pump light) at the facet of output fiber 210-2. Output fiber 210-2 then outputs the second signal+pump light. In some implementations, pump laser 285 may include a different number of pairs of input fibers 205 and output fibers 210 (e.g., three or more pairs of input fibers 205 and output fibers 210) than shown in FIG. 2H.

As shown in FIG. 2H, lens 225-1, lens 225-2, lens 225-3, and/or combiner 220 may not need to be duplicated in order to increase the number of fiber-pairs being managed (e.g., where two fiber pairs are managed in pump laser 285). However, in some implementations, a size of lens 225-1, lens 225-2, lens 225-3, and/or combiner 220 may need to be increased based at least in part on an arrangement and/or a number of fiber pairs. Additionally, source 290 (e.g., the chip with two emission points) should be scale such that a sufficient number of emission points of source light (each corresponding to a fiber pair) are provided. In some implementations, each of the multiple fiber-pairs and optical paths may share the same virtual image plane 227 and/or welding joint plane by virtue of using the same free-space optics of pump laser 285.

The number and arrangement of elements shown in FIGS. 2A-2H are provided as examples. In practice, pump lasers 250-285 may include additional elements, fewer elements, different elements, differently formed elements, differently designed elements, or differently arranged elements than those shown in FIGS. 2A-2H. For example, implementations containing two or more laser diodes are possible (e.g., where each laser diode emits one or more beams of pump light to be combined with one or more corresponding signal beams, as described above with regard to FIG. 2H). Additionally, or alternatively, a set of elements (e.g., one or more elements) of pump lasers 250-285 may perform one or more functions described as being performed by another set of elements of the pump lasers 250-285.

Implementations described herein provide a pump laser, including a combiner and three lenses in free-space of package, that provides a signal and a pumping beam as a combined optical signal. Advantages of the implementations described herein may include reducing use of physical space by the optical amplifier system, reducing a number of fibers in the optical amplifier system, reducing a number of fiber splices of the optical amplifier system, reducing size of optical components of the optical amplifier system, simplifying configuration and/or construction of the optical amplifier system, and/or reducing cost of implementing the optical amplifier system (e.g., as compared to a prior optical amplifier system that includes discrete components).

Further advantages of the implementations described herein may include reducing alignment sensitivity of the optical amplifier system such that the optical amplifier system has reduced sensitivity with respect to only three degrees of freedom (e.g., the x-direction, the y-direction, and the z-direction), thereby increasing manufacturability and/or reducing cost of the optical amplifier system (e.g., as compared to the prior optical amplifier system that includes a single lens between the laser diode and the combiner).

The foregoing disclosure provides illustration and description, but is not intended to be exhaustive or to limit the implementations to the precise form disclosed. Modifications and variations are possible in light of the above disclosure or may be acquired from practice of the implementations. For example, while pump lasers 250-285 are described and shown as including input fiber 205 and output fiber 210 being arranged with respect to a first side of combiner 220, and source 290 (e.g., DFB diode 215, FP diode 230, or the like) being arranged with respect to a second (opposite) side of combiner 220, other arrangements are possible. As a particular example, in some implementations, input fiber 205 may be arranged with respect to a first side of combiner 220, and source 290 and output fiber 210 may be arranged with respect to a second side of combiner 220. In such a case, combiner 220 may be configured to receive the signal light on the first optical path and send (e.g., transmit) the signal light on the third optical path, and to receive the pump light on the second optical path and send (e.g., reflect) the pump light on the third optical path.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A pump laser package, comprising:
an input fiber to send signal light on a first optical path in free-space inside a package,
where a first lens is arranged on the first optical path, where the first lens has a substantially consistent refractive index within a material of the first lens;
a source to send pump light on a second optical path in free-space inside the package,
where a second lens and a third lens are arranged on the second optical path,
where the third lens is a negative lens,
where the second lens and the third lens are separated by free-space inside the package, and
where the first lens and the third lens are arranged to create a virtual image, associated with the pump light, at a virtual image plane in free-space inside the package;
an output fiber on a third optical path in free-space inside the package,
where the first lens is arranged on the third optical path; and
a wavelength division multiplexing (WDM) filter in free-space inside the package to:
receive the signal light on the first optical path and send the signal light on the third optical path,
receive the pump light on the second optical path and send the pump light on the third optical path, and
where the WDM filter is arranged between the first lens and the third lens.

2. The pump laser package of claim 1, where the virtual image plane is located between the output fiber and the WDM filter on an optical axis of the pump laser package.

3. The pump laser package of claim 1, where a welding joint, associated with manufacturing or assembling the pump laser package, is located at the virtual image plane.

4. The pump laser package of claim 1, where the source comprises a distributed feedback diode.

5. The pump laser package of claim 1, where the source comprises a Fabry-Perot (FP) diode, and
where the output fiber includes a fiber Bragg grating to stabilize a wavelength of the pump light sent by the FP diode.

6. The pump laser package of claim 1, where the source is a Fabry-Perot (FP) diode, and
where the pump laser package further comprises a reflective narrowband device to reflect a portion of the pump light to the FP diode in free-space inside the package.

7. The pump laser package of claim 6, where the reflective narrowband device includes a coating on a surface of the output fiber, the WDM filter, the first lens, the second lens, or the third lens.

8. The pump laser package of claim 6, where the reflective narrowband device includes a volume holographic grating, a volume Bragg grating, a reflective narrowband filter, or a passband filter with partial reflection.

9. The pump laser package of claim 6, where the reflective narrowband device is a discrete component arranged in free-space inside the package.

10. The pump laser package of claim 6, where the reflective narrowband device and the WDM filter are integrated in a single component.

11. The pump laser package of claim 1, where at least one of:
a facet of the source that is to send the pump light is angled to reduce feedback received at the source;
a facet of the input fiber that is to send the signal light is angled to reduce feedback received at the input fiber or the source; or
a facet of the output fiber that is to receive the signal light and the pump light is angled to reduce feedback received at the output fiber or the source.

12. The pump laser package of claim 1, where the first optical path and the second optical path are substantially separate regions of free-space inside the package.

13. The pump laser package of claim 1, where a wavelength of the signal light is approximately equal to 1550 nanometers and a wavelength of the pump light is approximately equal to 980 nanometers.

14. The pump laser package of claim 1, where the WDM filter is arranged to receive the signal light on a first side of the WDM filter and receive the pump light on a second side of the WDM filter,
where the first side and the second side are opposite sides of the WDM filter, and
where the WDM filter is to reflect either the signal light received on the first side or partially reflect the pump light received on the second side.

15. The pump laser package of claim 1, where the package forms a portion of a fiber pigtail to the source.

16. A fiber coupled laser source, comprising:
an input fiber to send input light on a first optical path in free-space inside a package;
a laser diode to send source light on a second optical path in free-space inside the package;
an output fiber on a third optical path in free-space inside the package;
a first lens arranged on the first optical path and the third optical path,
the first lens comprising a material that has a substantially consistent refractive index;
a second lens and a third lens arranged on the second optical path,
the third lens being a negative lens,
the second lens and the third lens being separated by free-space inside the package, and
the first lens and the third lens being arranged to create a virtual image, associated with the source light, at a virtual image plane in free-space inside the package; and
a combiner arranged between the first lens and the second lens in free-space inside the package to:
receive the input light on the first optical path and send the input light on the third optical path, and
receive the source light on the second optical path and send the source light on the third optical path.

17. The fiber coupled laser source of claim 16, where the virtual image plane is located between the output fiber and the combiner on an optical axis of the fiber coupled laser source.

18. The fiber coupled laser source of claim 16, where a welding joint, associated with manufacturing or assembling the fiber coupled laser source, is located between the output fiber and the combiner.

19. The fiber coupled laser source of claim 16, where the first optical path and the second optical path are substantially separate regions of free-space inside the package.

20. The fiber coupled laser source of claim 16, where the input fiber is a first input fiber, the input light is first input light, the source light is first source light, the output fiber is a first output fiber, and the virtual image is a first virtual image, and
where the fiber coupled laser source further comprises:
a second input fiber to send second input light on a fourth optical path in free-space inside the package, the first lens being arranged on the fourth optical path;
the source to send second source light on a fifth optical path in free-space inside the package, the second lens and the third lens being arranged on the fifth optical path, and
the first lens and the third lens being arranged to create a second virtual image, associated with the second source light, at the virtual image plane in free-space inside the package;
a second output fiber on a sixth optical path in free-space inside the package,
where the first lens is arranged on the sixth optical path; and
the combiner to:
receive the second input light on the fourth optical path and send the second input light on the sixth optical path, and
receive the second source light on the fifth optical path and send the second source light on the sixth optical path.

21. A method, comprising:
sending, by an input fiber, signal light on a first optical path in free-space inside a package,
a first lens being arranged on the first optical path, the first lens having a substantially consistent refractive index within a material of the first lens;
sending, by a source, pump light on a second optical path in free-space inside the package,
a second lens and a third lens being arranged on the second optical path,
the second lens and the third lens being separated by free-space inside the package,
the first lens and the third lens creating a virtual image, associated with the pump light, at a virtual image plane in free-space inside the package, and
the third lens being a negative lens;
receiving, by a wavelength division multiplexing (WDM) filter arranged in free-space inside the package, the signal light on the first optical path,
the WDM filter being arranged between the first lens and the second lens;
receiving, by the WDM filter, the pump light on the second optical path;
sending, by the WDM filter, the signal light on a third optical path in free-space inside the package to an output fiber on the third optical path,
the first lens being arranged on the third optical path; and
sending, by the WDM filter, the pump light on the third optical path to the output fiber.

* * * * *